United States Patent
Candage (10) Patent No.: US 9,621,123 B2
(45) Date of Patent: Apr. 11, 2017

(54) METHODS AND CIRCUITRY TO TRIM COMMON MODE TRANSIENT CONTROL CIRCUITRY

(71) Applicant: International Rectifier Corporation, El Segundo, CA (US)

(72) Inventor: Anthony B. Candage, Meredith, NH (US)

(73) Assignee: INFINEON TECHNOLOGIES AMERICAS CORP., El Segundo, CA (US)

(*) Notice: Subject to any disclaimer, the term of this patent is extended or adjusted under 35 U.S.C. 154(b) by 0 days.

(21) Appl. No.: 14/835,973

(22) Filed: Aug. 26, 2015

(65) Prior Publication Data

US 2016/0065317 A1    Mar. 3, 2016

Related U.S. Application Data

(60) Provisional application No. 62/042,421, filed on Aug. 27, 2014.

(51) Int. Cl.
| | |
|---|---|
| H04B 15/00 | (2006.01) |
| H03G 3/20 | (2006.01) |
| H03F 3/45 | (2006.01) |
| H03F 1/26 | (2006.01) |
| H04L 25/02 | (2006.01) |
| H04L 25/08 | (2006.01) |
| H03F 1/32 | (2006.01) |

(52) U.S. Cl.
CPC .............. *H03G 3/20* (2013.01); *H03F 1/26* (2013.01); *H03F 1/3211* (2013.01); *H03F 3/45179* (2013.01); *H03F 3/45632* (2013.01); *H04B 15/00* (2013.01); *H04L 25/0266* (2013.01); *H04L 25/085* (2013.01); *H03F 2200/06* (2013.01); *H03F 2200/189* (2013.01); *H03F 2200/453* (2013.01); *H03F 2203/45562* (2013.01)

(58) Field of Classification Search
CPC ...... H03F 1/26; H03F 1/3211; H03F 3/45632; H03F 3/45179; H04L 25/0266; H04L 25/085; H03G 3/20; H04B 15/00
USPC .................................................. 375/285, 259
See application file for complete search history.

(56) References Cited

U.S. PATENT DOCUMENTS

| | | | |
|---|---|---|---|
| 2008/0051158 A1* | 2/2008 | Male ................... | H04L 25/0276 455/572 |
| 2011/0026612 A1* | 2/2011 | Lombardo ........... | H04L 25/0266 375/257 |
| 2011/0032734 A1 | 2/2011 | Melanson | |
| 2013/0114758 A1 | 5/2013 | Park et al. | |
| 2014/0062527 A1* | 3/2014 | Mills ................... | H03K 19/003 326/21 |
| 2014/0266433 A1* | 9/2014 | Nobbe ................. | H03F 1/30 330/151 |

(Continued)

*Primary Examiner* — Helene Tayong
(74) *Attorney, Agent, or Firm* — Chapin Intellectual Property Law, LLC (57) ABSTRACT

Embodiments herein include a replica communication path and monitor circuit to provide increased common mode transient immunity. As its name suggests, the monitor circuit monitors the replica communication path and produces an adjustment signal (common mode transient adjustment signal) to cancel presence of a common mode transient signal in one or more other communication paths conveying data signals.

24 Claims, 8 Drawing Sheets

(56) References Cited

U.S. PATENT DOCUMENTS

2014/0354357 A1* 12/2014 Shrestha ............. H03F 3/45071
                                                                     330/252

* cited by examiner

METHODS AND CIRCUITRY TO TRIM COMMON MODE TRANSIENT CONTROL CIRCUITRY

RELATED APPLICATIONS

This application is related to and claims the benefit of earlier filed U.S. Provisional Patent Application Ser. No. 62/042,421 entitled "Novel High Breakdown Voltage Isolation System Utilizing Capacitive Coupling Techniques," filed on Aug. 27, 2014, the entire teachings of which are incorporated herein by this reference.

BACKGROUND

As is well known, the common-mode rejection ratio (CMRR) of a differential amplifier (or other device) is a measure of common mode transient immunity. Specifically, CMRR is a measure of rejection by the device of unwanted input signals common to both input leads, relative to the wanted difference (communicated data) signal. An ideal differential amplifier would have infinite CMRR, meaning that the amplifier is able to analyze the received signal as if there were no unwanted signal present in the received signal. In general, infinite CMRR is not achievable in practice.

In certain instances, a respective communication system includes multiple circuits such as a transmitter and receiver that operate with respect to different ground potentials that vary greatly over time. In such an instance, providing common mode transient immunity is desirable because it ensures reliable transmission of data.

BRIEF DESCRIPTION

For low to moderate slew rate common mode transients (such as 10 kV/us to 35 kV/us), the challenge to managing common mode transient immunity (such as CMTI) events across a High-Voltage Isolation Barrier is the control of the common-mode (CM) impedance at the receiver end of the barrier. For high slew rate transients (>35 kV/us to levels in excess of 100 kV/us), CM impedance control is still paramount and more challenging, but a second order effect due to common-mode to differential-mode conversion due to device mismatch becomes a challenge to address.

Embodiments herein address the high bandwidth common-mode impedance control problem, creating a vehicle for common-mode to differential-mode conversion mitigation.

A high-voltage, high slew-rate CMTI event can be seen by the isolation barrier in such a way that the CM bias points of the various interface circuits maintain proper linear operation so as to avoid gross distortion of the signaling interface. This implies a low CM impedance input on the receiver interface to counter the loading of the coupling capacitance during a CMTI event. However, to maintain good receive signal amplitude for robust signal-to-noise, the differential interface must offer minimal signal attenuation which implies large differential-mode (DM) impedance. Therefore, one desirable goal as further described herein is to supply a mechanism to maintain large DM impedance (for minimal DM attenuation) and small CM impedance (for minimal bias point excursions during CMTI events).

Yet further as described herein, by employing a replica (secondary) communication path to copy the common mode transients into a primary communication path, so as to oppose the CMTI events in an open-loop fashion. Such a configuration provides cancellation of a high bandwidth common mode transient immunity.

One embodiment herein includes a first apparatus/system that provides increased common mode transient immunity with respect to conventional techniques. For example, in one embodiment, the first apparatus/system comprises: a first communication path, a second communication path, and a monitor circuit. The first communication path couples a first node of a first circuit (such as a transmitter circuit) to a first node of a second circuit (such as a receiver circuit). The second communication path (such as a replica path) couples a second node of the first circuit to a second node of the second circuit. Both the first communication path and the second communication path are exposed to substantially the same common mode transients.

During use, the first communication path conveys a communication signal to the second circuit. In one embodiment, no data or AC signal is transmitted over the second communication path.

Note that the common mode transient can be caused by any conditions such as differences in ground potentials (such as ground G1 and ground G2) between the first circuit and the second circuit, a lightning strike, electrostatic discharge, etc.

As further described herein, the monitor circuit monitors the second node of the second circuit (in replica path) and then generates an adjustment signal (i.e., a cancellation signal). The monitor circuit outputs the adjustment signal to the first node of the second circuit to cancel the common mode transient present on the first communication path.

The techniques of providing common mode transient immunity can be applied to a single communication path, a differential communication path including multiple communication paths, etc.

Embodiments herein further include a second apparatus/system in which to trim one or more parameters of a respective circuit that provides common mode transient immunity. For example, in one embodiment, the second apparatus/system comprises: a first communication path, a second communication path (such as a replica communication path), a monitor circuit, and a gain modifier circuit.

The first communication path and the second communication path are exposed to a common mode transient. Exposure to the common mode transient induces a first common mode transient signal onto the first communication path and a second common mode transient signal onto the second communication path. In one embodiment, the first common mode transient signal and a second common mode transient signal are substantially the same.

The monitor circuit derives an adjustment signal based on detected presence of the second common mode transient signal present on the second communication path. The gain modifier circuit modifies a gain setting that is applied to subsequent derived adjustment signals produced by the monitor circuit to provide better common mode transient immunity. In other words, the first common mode transient signal may not precisely match the second common mode transient signal due to electrical parameter (e.g., capacitance, impedance, differential mode, etc.) mismatch in each of the paths. The modified gain is applied to the subsequent adjustment signals during subsequent operation so that the generated adjustment signals (representative of the common mode transient on the replica communication path) more closely match the common mode induced transient signals on the first communication path, thus providing better common mode transient immunity.

These and other more specific embodiments are disclosed in more detail below.

It is to be understood that the system, method, apparatus, etc., as discussed herein can be embodied strictly as hardware, as a hybrid of software and hardware, or as software alone such as within a processor, or within an operating system or a within a software application. Example embodiments of the invention may be implemented within products and/or software applications such as those developed or manufactured by International Rectifier Corporation of El Segundo, Calif., USA.

Additionally, note that although each of the different features, techniques, configurations, etc., herein may be discussed in different places of this disclosure, it is intended, where appropriate, that each of the concepts can optionally be executed independently of each other or in combination with each other. Accordingly, the one or more present inventions as described herein can be embodied and viewed in many different ways.

Also, note that this preliminary discussion of embodiments herein purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention(s), the reader is directed to the Detailed Description section and corresponding figures of the present disclosure as further discussed below.

BRIEF DESCRIPTION OF THE DRAWINGS

The foregoing and other objects, features, and advantages of the invention will be apparent from the following more particular description of preferred embodiments herein, as illustrated in the accompanying drawings in which like reference characters refer to the same parts throughout the different views. The drawings are not necessarily to scale, with emphasis instead being placed upon illustrating the embodiments, principles, concepts, etc.

DETAILED DESCRIPTION

As further described below, embodiments herein include a replica communication path and monitor circuit to provide increased common mode transient immunity. As its name suggests, the monitor circuit monitors the replica communication path and produces an adjustment signal (common mode transient adjustment signal) to cancel presence of a common mode transient signal in one or more other communication paths conveying data signals.

Figure 1:
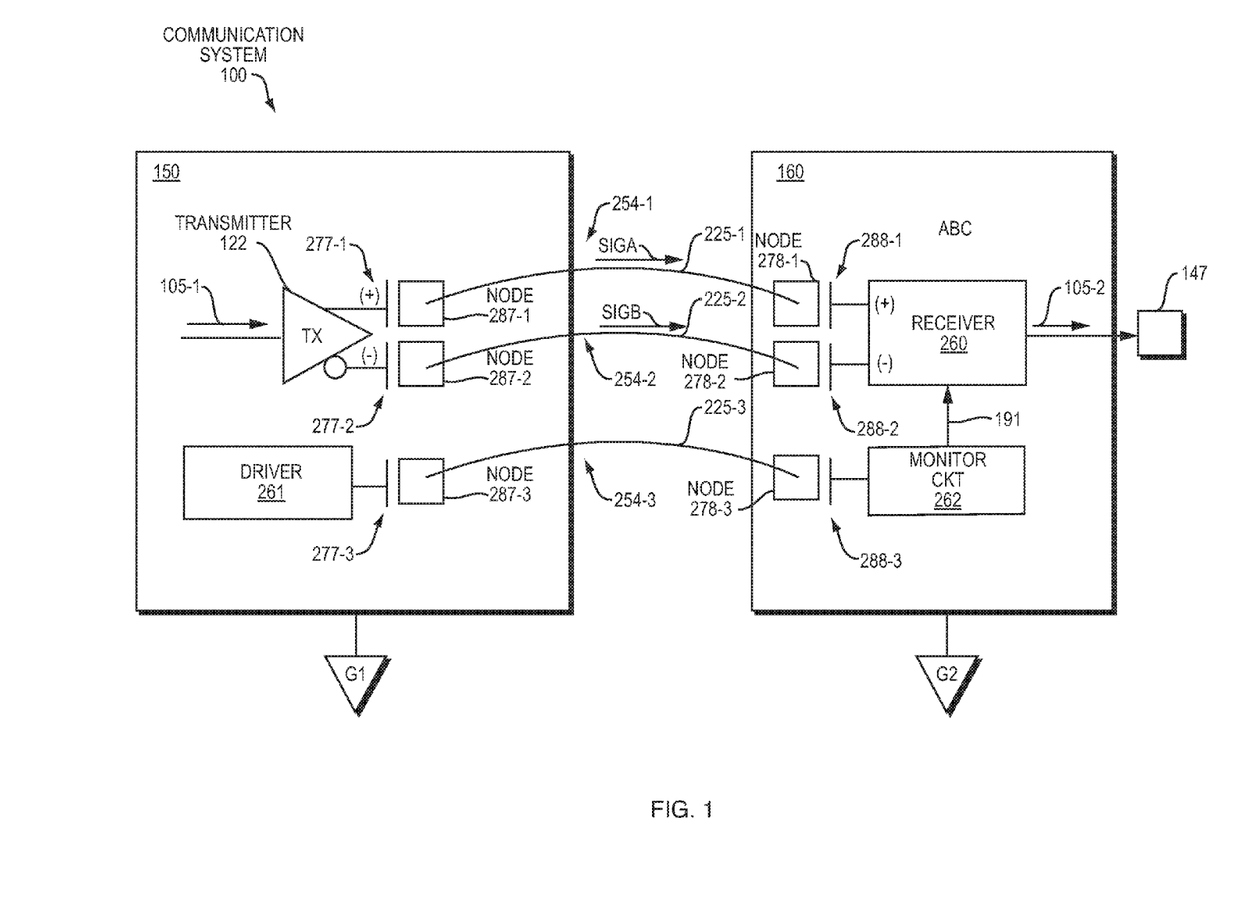
FIG. 1 is an example diagram of a communication system according to embodiments herein.

Now, more specifically, FIG. 1 is an example diagram of a communication system according to embodiments herein.

As shown, communication system 100 includes transmitter circuitry 150 and receiver circuitry 160. In one non-limiting example embodiment, the transmitter circuitry 150 is fabricated on a first semiconductor die; the receiver circuitry is fabricated on a second semiconductor die. The transmitter circuitry 150 and receiver circuitry 160 are coupled via corresponding communication links 225. During operation, communication links 225 (such as bond wires or other suitable media) convey signals from the transmitter circuitry 150 to the receiver circuitry 160.

As further shown, transmitter circuitry 150 is electrically coupled to ground G1. Receiver circuitry 160 is electrically coupled to ground G2. In one embodiment, ground G1 and ground G2 fluctuate with respect to each other. Variations in voltage between the first ground G1 and the second ground G2 can be greater than 1000 V in certain instances.

Communication paths 254-1 and 254-2 support conveyance of communications from the transmitter circuitry 150 to the receiver circuitry 160. The positive (+) output of transmitter 122 is electrically connected to first communication path 254-1. As further shown, communication path 254-1 includes a combination of capacitive pad 277-1, communication link 225-1, and capacitive pad 278-1 connected in series. Presence of the capacitive pads 277-1 and 278-1 (such as on the order of the femto-farads, pico-farads, etc.) provides a degree of common mode transient immunity because such components pass AC signals and block DC signals produced by the transmitter 122.

The negative output (−) of transmitter 122 is electrically connected to second communication path 254-2. The communication path 254-2 includes a combination of capacitive pad 277-2, communication link 225-2, and capacitive pad 278-2 connected in series. Presence of the capacitive pads 277-2 and 278-2 provides a degree of common mode transient immunity because such components pass AC signals and block DC signals produced by the transmitter 122.

Communication system 100 further includes a replica path 254-3 extending between driver 261 and monitor circuit 262. As its name suggests, characteristics (such as impedance, capacitance, inductance, resistance, etc.) of replica path 254-3 are fabricated to fairly closely match communication path 254-1 and communication path 254-2, which are substantially similar to each other as well.

In one embodiment, the monitor circuit 262 is a low-impedance input receiver circuit. As will be discussed further in the specification, the low-impedance input receiver circuit, via signals 191, sinks current from and/or sources current to the node 288-1 and node 288-2 depending on detected states of a common mode transient signal received over the replica communication path 254-3.

As previously discussed, the replica path 254-3 is substantially matched to each of the first communication path 254-1 and the second communication path 254-2. For example, in one embodiment were possible, the capacitance of capacitive pads 277-1, 277-2, and 277-3 are fabricated to be within a couple percent of each other. Similarly, the capacitance of capacitive pads 278-1, 278-2, and 278-3 are fabricated to be within a couple percent of each other.

During operation, the transmitter 122 receives input signal 105-1 and produces a corresponding differential output signal that drives respective node 287-1 and node 287-2. The first communication path 254-1 including communication link 225-1 conveys the (+) communication signal A produced by the transmitter 122 to the (+) input of the receiver 260. The second communication path 254-2 including communication link 225-2 conveys the (−) communication signal B produced by the transmitter 122 to the (−) input of the receiver 260.

The output of driver 261 is electrically connected to the replica path 254-3. During operation, as discussed below in the following FIGS., the driver circuitry 261 outputs a respective DC signal over communication link 225-3 to the monitor circuit 262. The monitor circuit 262 produces adjustment signals 191 based on a detected common mode transient signal received over the replica communication path 254-3 at the monitor circuit 262.

In one embodiment, the adjustment signals 191 generated by the monitor circuit 262 accurately simulate any common mode transient signals detected on the replica communication path 254-3. As a further example, the monitor circuit 262 can be configured to detect an amount of current (as induced by the common mode transients) received over the replica communication path 225-3. Because each of the communication paths are substantially matched, the common mode transient signals on each of the communication path 254 are substantially similar.

As further shown, the monitor circuit 262 produces the adjustment or cancellation signals 191 (as current driver signals) that are substantially equivalent in magnitude to the detected amount of current received over the replica communication path 225-3.

As further discussed below, the monitor circuit 262 outputs the adjustment signals 191 to the receiver 260 and specifically to nodes 288-1 and 288-2. Application of the adjustment signals 191 to remove or cancel common mode transient signals conveyed over respective communication link 225-1 and 225-2.

As previously discussed, the common mode transients can occur on the communication path 254 as a result of variability in ground potentials G1 and G2, lightning strikes, electrostatic discharge, etc.

Thus, as a summary of operation described thus far, the monitor circuit 262 monitors node 288-3 for presence of a respective common mode transient signal. Because of the symmetry of the first communication path 254-1, second communication path 254-2, and the replica path 254-3, each of such paths conveys a substantially similar common mode transient signal. The receiver 260 utilizes the received adjustment signals 191 to remove or cancel presence of common mode transient signals received on each of the first communication path 254-1 and the second communication path 254-2. In addition to canceling presence of the common mode transients, the receiver 260 converts the cleaned differential input signal (after the common mode transient has been removed) received over the first communication path 254-1 and the second communication path 254-2 into output signal 105-2.

Removal of the common mode transients from the communication paths 254-1 and 254-2 enables the receiver 260 to more accurately identify states of data transmitted via signal A and signal B. Decoder circuitry 147 (detection circuit) decodes the output signal 105-2.

Figure 2:
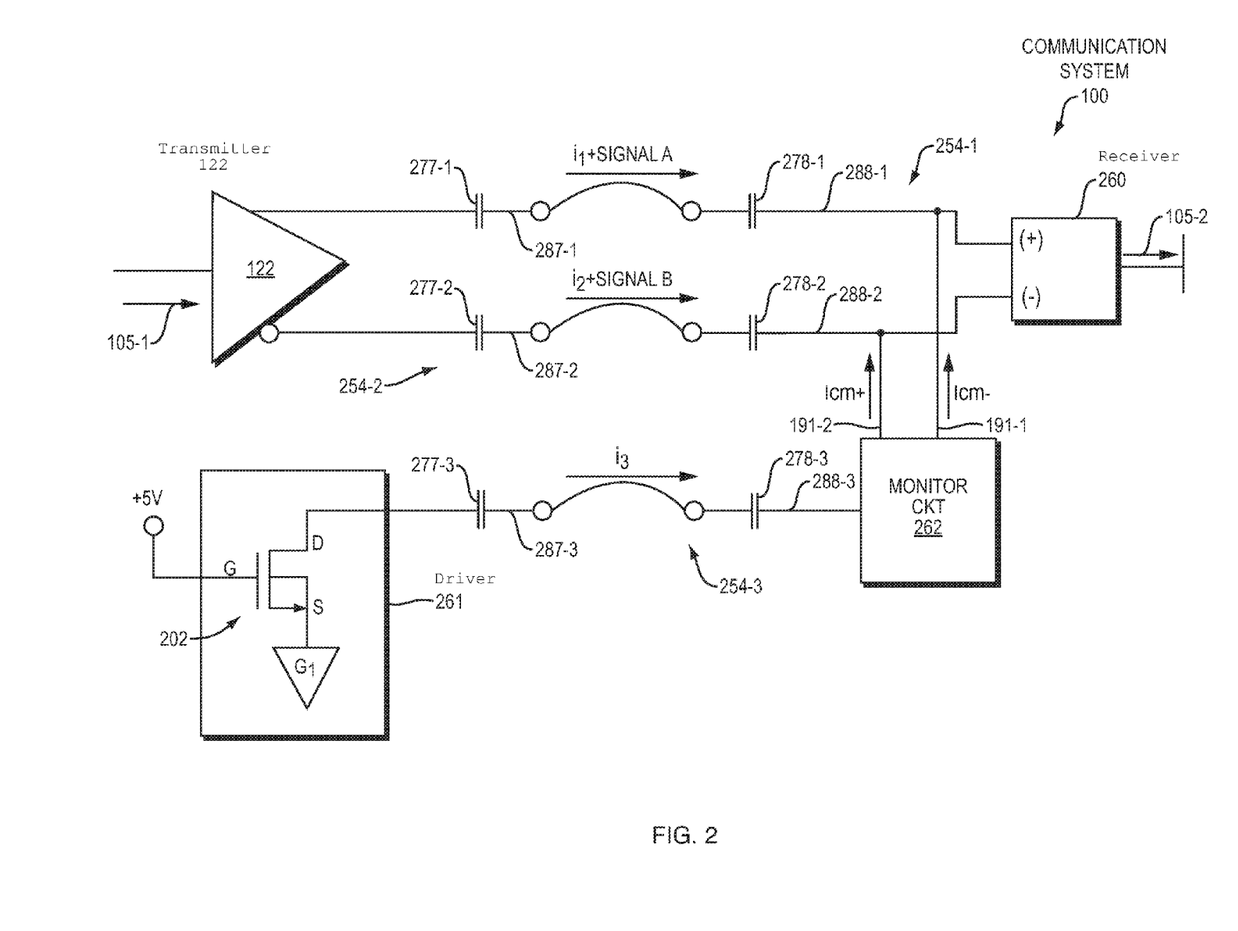
FIG. 2 is an example diagram of the interconnectivity of components in a communication system according to embodiments herein.

FIG. 2 is an example diagram illustrating a communication system according to embodiments herein.

As shown, transmitter 122 outputs signal A over the first communication path 254-1 to the positive input of receiver 260. The transmitter 122 transmits signal B over the second communication path 254-2 to the negative input of receiver 260.

As previously discussed, the first communication path 254-1 includes a series capacitance to convey a combination of AC attributes of the communication signal A and a first common mode transient signal I1 to the node 288-1, which is the (+) input of receiver 260; as previously discussed, the first common mode signal I1 is induced onto the first communication path 254-1 by the common mode transient such as caused by a change in voltage between ground G1 and ground G2.

The second communication path 254-2 includes a series capacitance to convey a combination of AC attributes of the communication signal B and a second common mode transient signal I2 to the node 288-2, which is the (−) input of receiver 260; as previously discussed, the second common mode signal I2 is also induced onto the second communication path 254-2 by the common mode transient such as caused by the change in voltage between ground G1 and ground G2.

As previously discussed, the overall series capacitance of the replica communication path 254-3 is substantially matched to the first communication path 254-1 and the second communication path 254-2. The current through each of the communication paths 254 is dictated by $I=c(dV/dT)$.

Further in this example embodiment, the driver circuit 261 includes transistor 202. The gate of transistor 202 is set to 5 V such that the transistor 202 is continuously set to an ON state, driving a DC voltage (such as ground G1) over the respective replica communication path 254-3. In such an instance, there is, in theory, no AC data signal conveyed over replica path 254-3 from driver circuitry 261 except the corresponding common mode transient signal I3. In other words, in accordance with one embodiment, the replica communication path 254-3 purposely conveys only a common mode transient signal I3 to the node 288-3.

As previously discussed, each of the communication paths 254 is exposed to common mode transients that induce respective common mode transient signals on each of the communication paths 254. Because the communication paths 254 are substantially matched, each of the communication paths 254 conveys substantially the same common mode transient signal to the receiver circuit 160. That is, in one embodiment, common mode transient signal I1, common mode transient signal I2, and common mode transient signal I3 are substantially equal.

Thus, in addition to conveying signal A, communication path 254-1 conveys common mode transient signal I1 (such as AC current or a first common mode transient signal) to the positive input of receiver 260; in addition to conveying signal B, communication path 254-2 conveys common mode transient signal I2 (such as AC current or a second common mode transient signal) to the negative input of receiver 260; communication path 254-3 substantially conveys common mode transient signal I3 to the input of monitor circuit 262.

Monitor circuit 262 processes the received common mode transient signal I3. Based on the received transient signal I3, monitor circuit 262 produces a first adjustment signal 191-1 to be substantially similar in magnitude to the received common mode transient signal I3. Additionally, the monitor circuit 262 produces a second adjustment signal 191-2 to be substantially similar in magnitude to the received common mode transient signal I3.

In one embodiment, each of the adjustment signals 191-1 and 191-2 is a simulated current drive signal outputted from the monitor circuit 262. A magnitude of the simulated current drive signal (i.e., adjustment signal 191-1) is substantially equal to a magnitude of current induced by the common mode transient signal I1 onto the first communication path 254-1. A magnitude of the simulated current drive signal (i.e., adjustment signal 191-2) is substantially equal to a magnitude of current induced by the common mode transient signal I2 onto the first communication path 254-1.

The monitor circuit 262 physically outputs/applies the adjustment signal 191-1 to node 288-1, which is the same as the (+) input receiver 260. Because the adjustment signal 191-1 (which is a simulation of the magnitude of signal I3, but is inverted or negative) substantially matches a magnitude of the transient signal I1, the common mode transient signal I1 is substantially removed or canceled from the communication path 254-1. In other words, input of the adjustment signal 191-1 to node 288-1 substantially cancels common mode transient signal I1 from being present on the first communication path 254-1. The result is that the positive (+) input of receiver 260 receives (approximately) only an attenuated version of signal A generated by the respective transmitter 122.

Note that, due to attenuation, the signal A received by the positive input of receiver 260 is substantially reduced in magnitude with respect to the magnitude of the original signal outputted by the transmitter 122.

In a similar manner, the monitor circuit 262 physically outputs/applies the adjustment signal 191-2 to node 288-2. Because the adjustment signal 191-2 (which is a simulation of the magnitude of signal I3, but is inverted or negative) substantially matches the transient signal I2, the common mode transient signal I2 is substantially removed or canceled from the communication path 254-2. The result is that the negative input of receiver 260 receives (approximately) only an attenuated version of signal B generated by the respective transmitter 122.

Note that, due to attenuation, the signal B received by the positive input of receiver 260 is substantially reduced in magnitude with respect to the magnitude of the original signal outputted by the transmitter 122.

Accordingly, the inclusion of the replica communication path 254-3 in the monitor circuit 262 produces and/or eliminates presence of common mode transients on communication path 254-1 and 254-2. The receiver 260 is therefore able to more accurately identify states of the transmitted data signal captured by the combination of signal A and signal B.

Figure 3:
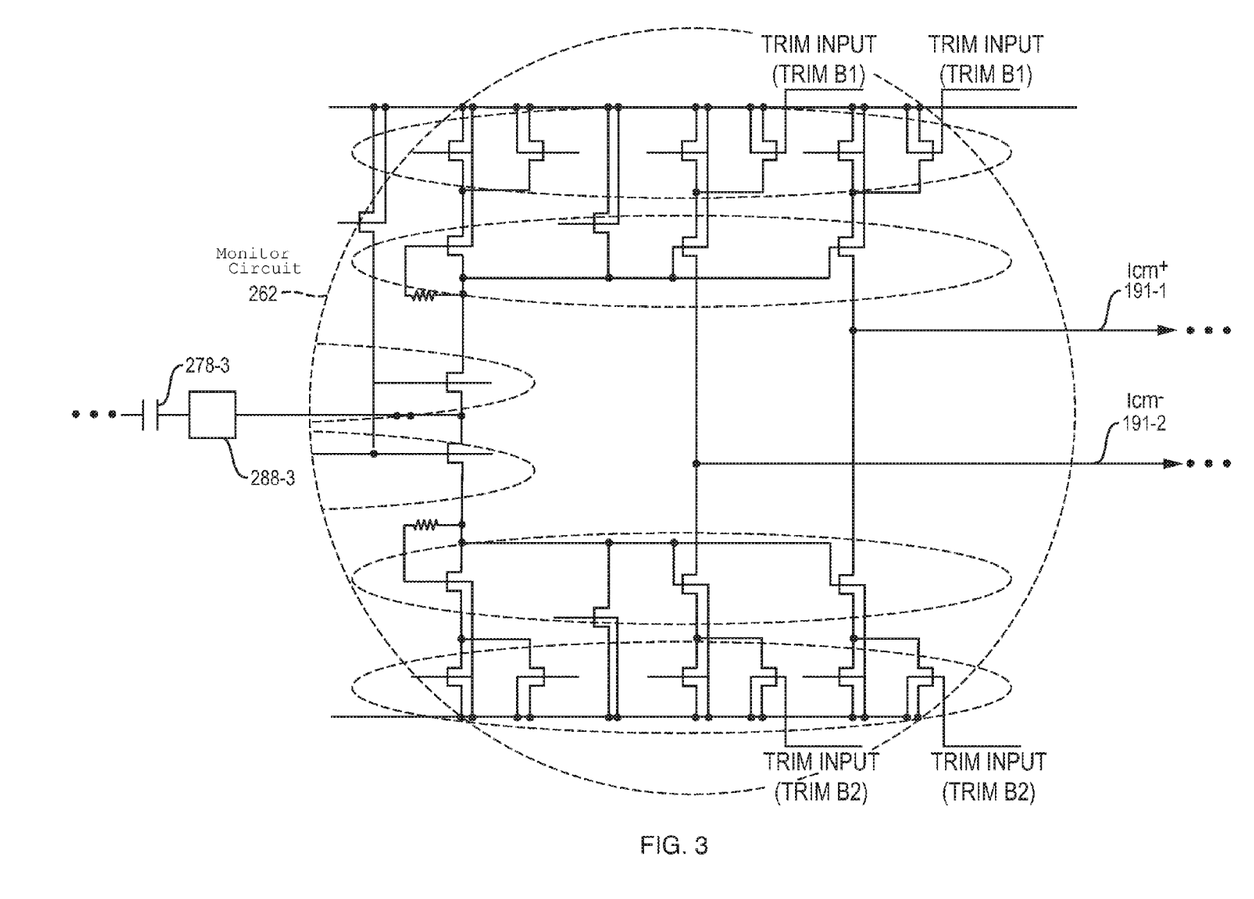
FIG. 3 is an example of transistor diagram of a monitor circuit according to embodiments herein.

FIG. 3 is an example of transistor diagram of a monitor circuit according to embodiments herein. As shown, and as previously discussed, monitor circuit 262 is electrically coupled to receive input from node 288-3 of the capacitive pad 278-3 in communication path 254-3. The monitor circuit 262 outputs adjustment signals 191-1 and 191-2 in a manner as previously discussed. As will be discussed later in the specification, the gain associated with the adjustment signals 191 can be modified via trim input with respect to monitor circuit 262.

Figure 4:
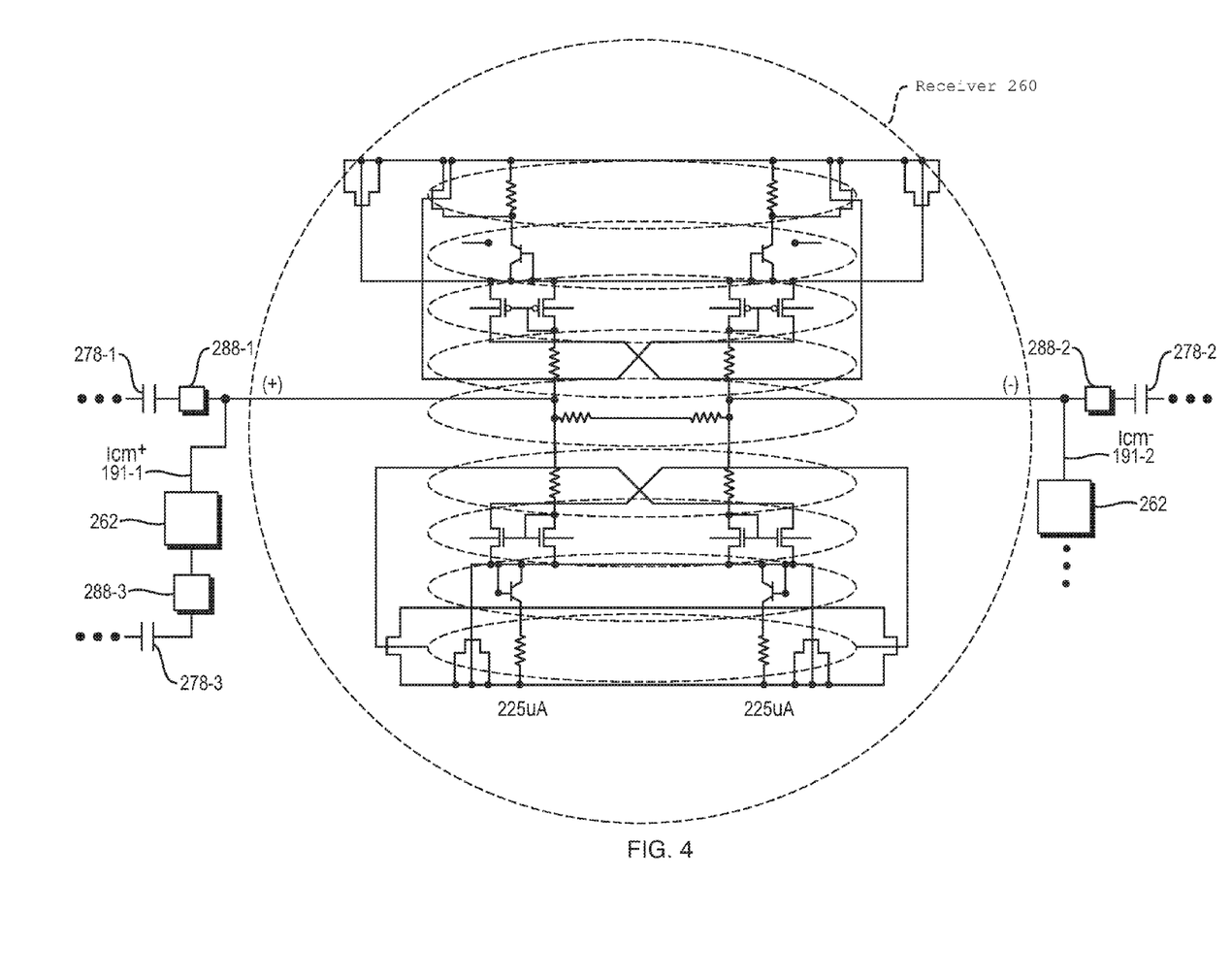
FIG. 4 is an example diagram of a receiver circuit according to embodiments herein.

FIG. 4 is an example diagram of a receiver circuit according to embodiments herein. As shown, the positive input (+) of the receiver 260 is electrically coupled to node 288-1 of the capacitive pad 278-1. To remove common mode transient signal I1 (which is substantially equal to I2 and I3) from the communication path 254-1, the monitor circuit 262 produces and outputs signal 191-1 to node 288-1. As further shown, to remove common mode transient signal I2 from the communication path 254-2, the monitor circuit 262 produces and outputs signal 191-2 to node 288-2.

Figure 5:
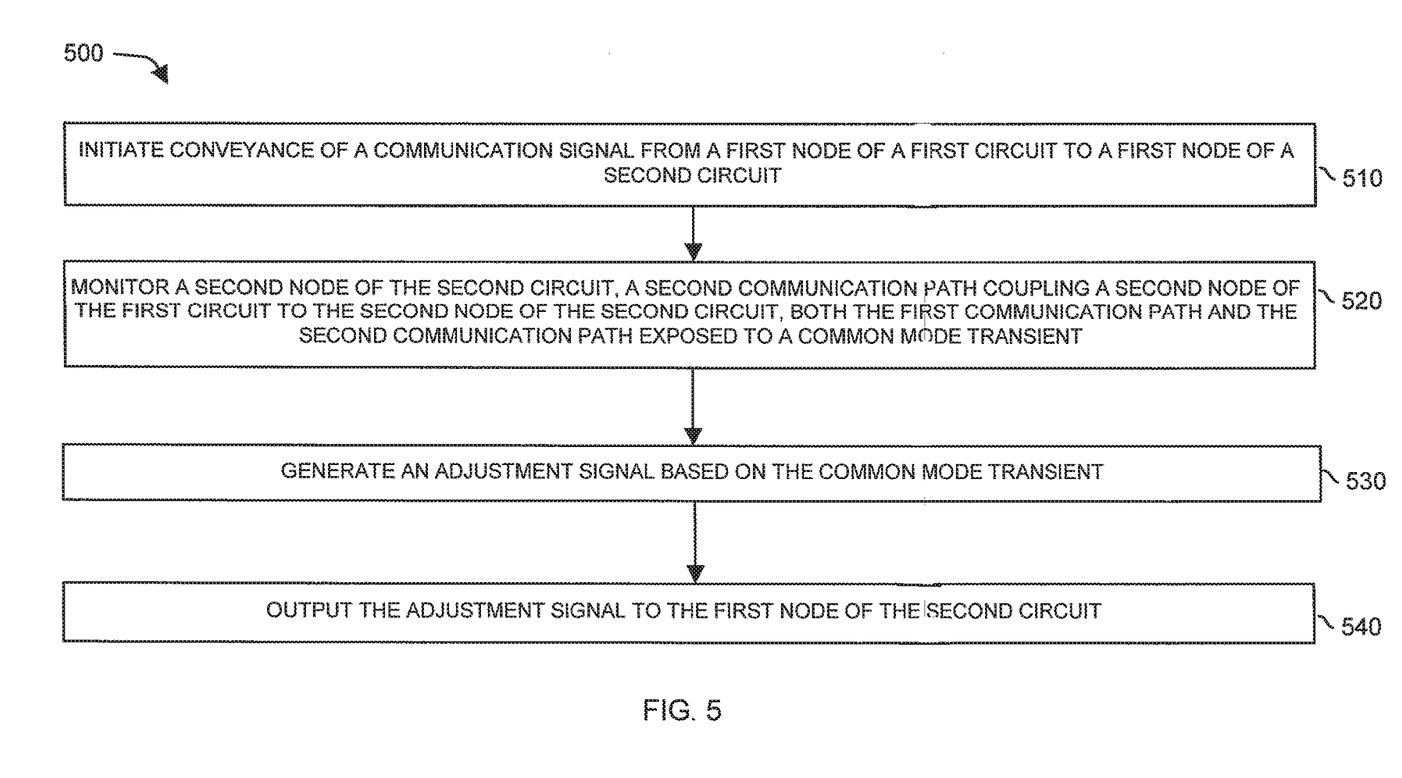
FIG. 5 is an example diagram illustrating a method of providing common mode transient immunity according to embodiments herein.

FIG. 5 is a flowchart 500 illustrating an example method of providing common mode transient immunity according to embodiments herein. Note that there will be some overlap with respect to concepts as discussed above. Also, the steps can be executed in any suitable order.

In processing block 510, the first communication link 254-1 conveys a communication signal from a first node (such as node 277-1) of a first circuit to a first node (such as node 288-1) of a second circuit.

In processing block 520, the monitor circuit 262 monitors a second node (288-3) of the second circuit, a second communication path (such as communication path 254-3) coupling a second node of the first circuit to the second node of the second circuit, both the first communication path and the second communication path exposed to a common mode transient.

In processing block 530, the monitor circuit generates an adjustment signal 191-1 based on the common mode transient.

In processing block 540, the monitor circuit outputs (applies) the adjustment signal 191-1 to the first node (node 288-1) of the second circuit.

Figure 6:
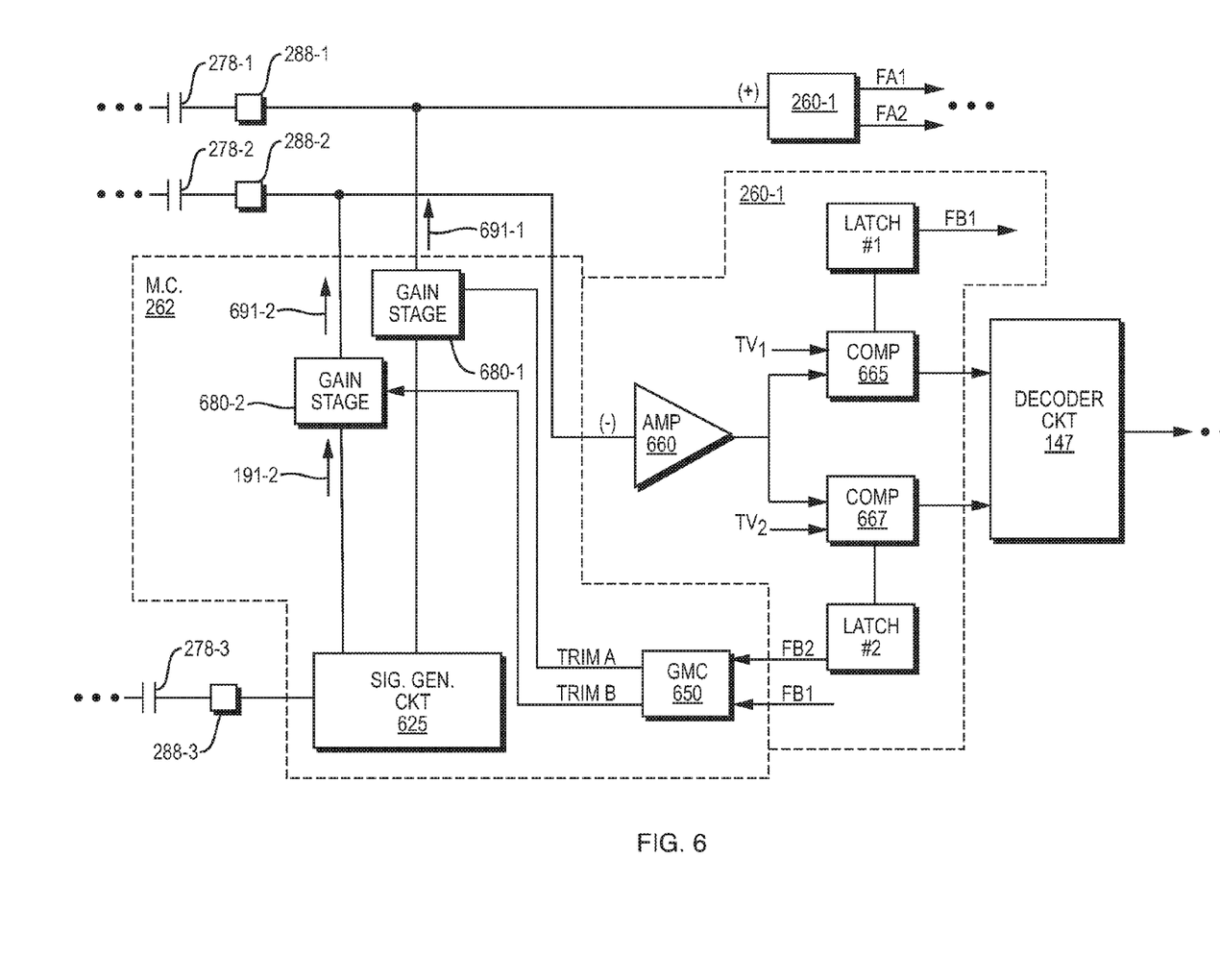
FIG. 6 is an example diagram illustrating a system for trimming gain settings to provide better common mode transient immunity according to embodiments herein.

FIG. 6 is an example diagram illustrating a communication system according to embodiments herein.

As shown in this embodiment, to address electrical attribute mismatches in the communication paths 254, and to provide yet higher common mode transient immunity, the monitor circuit 262 can be configured to provide gain control with respect to each of the adjustment signals 191-1 and 191-2.

For example, in this example embodiment, gain stage GS1 applies GAIN1 to the adjustment signal 191-1 to produce adjustment signal 691-1 that more accurately cancels common mode transient signals I1 present on the communication path 254-1. Gain stage GS2 applies GAIN2 to the adjustment signal 191-2 to produce adjustment signal 691-2 that more accurately cancels common mode transient signals I2 present on communication path 254-2.

One reason for a possible mismatch between simulated output 191-1 and 191-2 (as derived from common mode transient I3) with respect to each of common mode transient I1 and common mode transient I2 is that the capacitance in each of the respective communication path 254 does not match exactly as a result of fabrication imperfections.

For example, as an example of one component mismatch, assume that the combination of capacitance associated with capacitive pad 277-1 and capacitive pad 278-1 in communication path 254-1 do not match the combination of capacitance associated with capacitance pad 277-3 and capacitive pad 278-3 in communication path 254-3. Assume that the combination of capacitance associated with capacitive pad 277-2 and capacitive pad 278-2 in communication path 254-2 do not match the combined capacitance of capacitance pad 277-3 and capacitive pad 278-3 in communication path 254-3.

To account for this mismatch condition (capacitive mismatch), and possibly other mismatch conditions causing CM-DM conversion inaccuracies, as further discussed below, the gain modifier circuit 650 controls the gain settings GS1 and GS2 to account for any detected mismatch between the replica communication path 254-3 and each of the first communication path 254-1 and the second communication path 254-2.

More specifically, to account for the mismatch, the monitor circuit 262 includes gain modifier circuit 650, which controls settings of gain stage 680-1 and gain stage 680-2. To determine how to set the respective gains of gain stage 680-1 and gain stage 680-2, the communication paths 254 are exposed to a common mode transient. In one embodiment, exposure to the common mode transient is done when the transmitter 122 simultaneously drives both the first communication path 254-1 and the second communication path 254-2 with DC signals during a test mode. For a current gain setting (such as initially 1.0), if the gain modified adjustment signals 691-1 and 691-2 properly cancel respective common mode transient signals I1 and I2, there should be no AC voltage detected at the positive and negative input of the receiver 260.

Recall that exposure to the common mode transient (such as a change in ground voltage G1 with respect to ground voltage G2) induces: a first common mode transient signal I1 onto the first communication path 254-1; a second common mode transient signal I2 onto the second communication path 254-2; and a third common mode transient signal I3 onto the replica communication path 254-3. As previously discussed, the monitor circuit 262 (signal generator circuit 625 in this example) derives adjustment signal 191-1 and 191-2 based on detected presence of the common mode transient signal I3 present in the replica communication path 254-3.

Because the transmitter 122 transmits no signal A in this example during the test mode of determining proper gain settings, but transmitter 122 only transmits a DC signal the respective communication path 254-1, in theory, there should be no AC voltage present on node 288-1 if the gain modified adjustment signal 691-1 exactly matches the common mode transient I1 during a respective common mode transient. Similarly, because the transmitter 122 transmits no signal B in this example during the test mode, but only transmits a DC signal over the respective communication path 254-2, in theory, there should be no AC voltage present on node 288-2 if the gain modified adjustment signal 691-1 exactly matches the common mode transient I2 during the respective common mode transient.

During the test mode and repeated exposure of the communication path 254 to a common mode transient, the monitor circuit 262 dynamically controls a sensitivity of the threshold voltage TV1 associated with comparator 665 and threshold voltage TV2 associated with compared or 667 to be relatively large to start. For example, assume that there is a 3% mismatch between the adjustment signal 191-2 and the common mode transient signal I2 due to component mismatch errors. In such an instance, to detect the error, the gain modifier circuit 650 sets the threshold value TV1 to a zero setting plus a first offset value; the gain modifier circuit 650 sets the threshold value TV2 to the zero setting minus the first offset value. In this example, because there is a mismatch 3%, the signal outputted from the amplifier 660 is not the zero value (which it would be if there was no mismatch between the adjustment signal 191-2 and the common mode transient signal I2).

The comparator 665 monitors the output signal of the amplifier 660 to detect if the output signal of the amplifier 660 rises above the threshold value TV1. If the output signal rises above the threshold value TV1, comparator 665 sets a respective latch to produce feedback FB1, notifying the gain modifier circuit 650 that the current setting of magnitude of GS2 is too large. In such an instance, the gain modifier circuit 650 controls trim settings (TRIMB) applied to gain stage 680-2 to reduce the gain setting GS2 by a predetermined amount depending on the threshold value TV1.

Conversely, if the output signal of the amplifier 660 falls below the threshold value TV2, comparator 667 produces feedback FB2 indicating that the magnitude of GS2 is currently too small. In such an instance, the gain modifier circuit 650 controls trim settings (TRIMB) applied to the gain stage 680-2 to increase the gain setting GS2 depending on a magnitude of threshold value TV2.

Thus, the feedback FB1 and FB2 indicates whether a magnitude of a given adjustment signal 691-2 matches a magnitude of a corresponding common mode transient signal I2 present on the communication path 254-2 for the most recent test.

The gain modifier circuit 650 and related circuit repeats the process of successively lowering the threshold values TV1 and TV2 nearer the zero setting for subsequent gain tests to fine tune trim settings applied to the gain stage 680-2. In a manner as discussed above, the gain modifier circuit 650 performs trimming of the respective gain stages until the mismatch is substantially reduced such as to less than 0.2%. As mentioned, the gain modifier circuit 650 in the monitor circuit 262 can be configured to increase the sensitivity of testing accuracy by lowering magnitudes of the threshold voltages TV1 and TV2 with respect to the zero setting. If subsequent feedback FB1 and/or FB2 indicates an output above/below a respective threshold value, the gain modifier circuit 650 performs a respective trim to the gain stage 680-2.

Subsequent to performing trim operations as discussed above to determine appropriate settings for gain stage 680-1 and gain stage 680-2, the gain modifier circuit 650 stores the trim information and, using the store trim information, subsequently controls corresponding gain settings GS1 and GS2 applied to subsequent derived adjustment signals 191-1 and 191-2 produced by the monitor circuit 262 when receiving differential signal A and signal B during a normal operational mode. In other words, during the normal operational mode, the gain circuit 680-2 applies the gain setting GS2 to gain-adjust a subsequent transient signal I2 detected on the communication path 254-2. In such an instance, to provide common mode transient cancellation as previously discussed, the gain stage 680-2 outputs the gain-adjusted subsequent transient signal (i.e., adjustment signal 691-2) to the communication path 254-2.

Further, as previously discussed, the gain modifier circuit 650 trims the gain stages 680 such that a magnitude of the modified adjustment signals 691-1 and 691-2 more closely match the corresponding common mode transient signals I1 and I2. Thus, even though the respective capacitance in each of the communication paths 254 initially may be mismatched with respect to each other, trimming of the gain stages 680 ensures higher common mode transient immunity via more accurate cancellation of corresponding common mode transient signals I1 and I2.

Receiver 260-1 operates in a similar manner as receiver 260-2. As further shown, note that the gain modifier circuit 650 receives feedback FA1 and FA2 from the receiver 260-1 (monitoring the + input) to determine how to control gain settings (TRIMA) of gain stage 680-1.

As discussed above, there are many different types of electrical parameter variations in each of the signal paths that can contribute to signal degradation and lower performance conversion. Note that techniques of trimming gains to cancel CM-to-DM conversion inaccuracies remedies all types of mismatch errors, not just capacitor mismatch in each of the paths.

Figure 7:
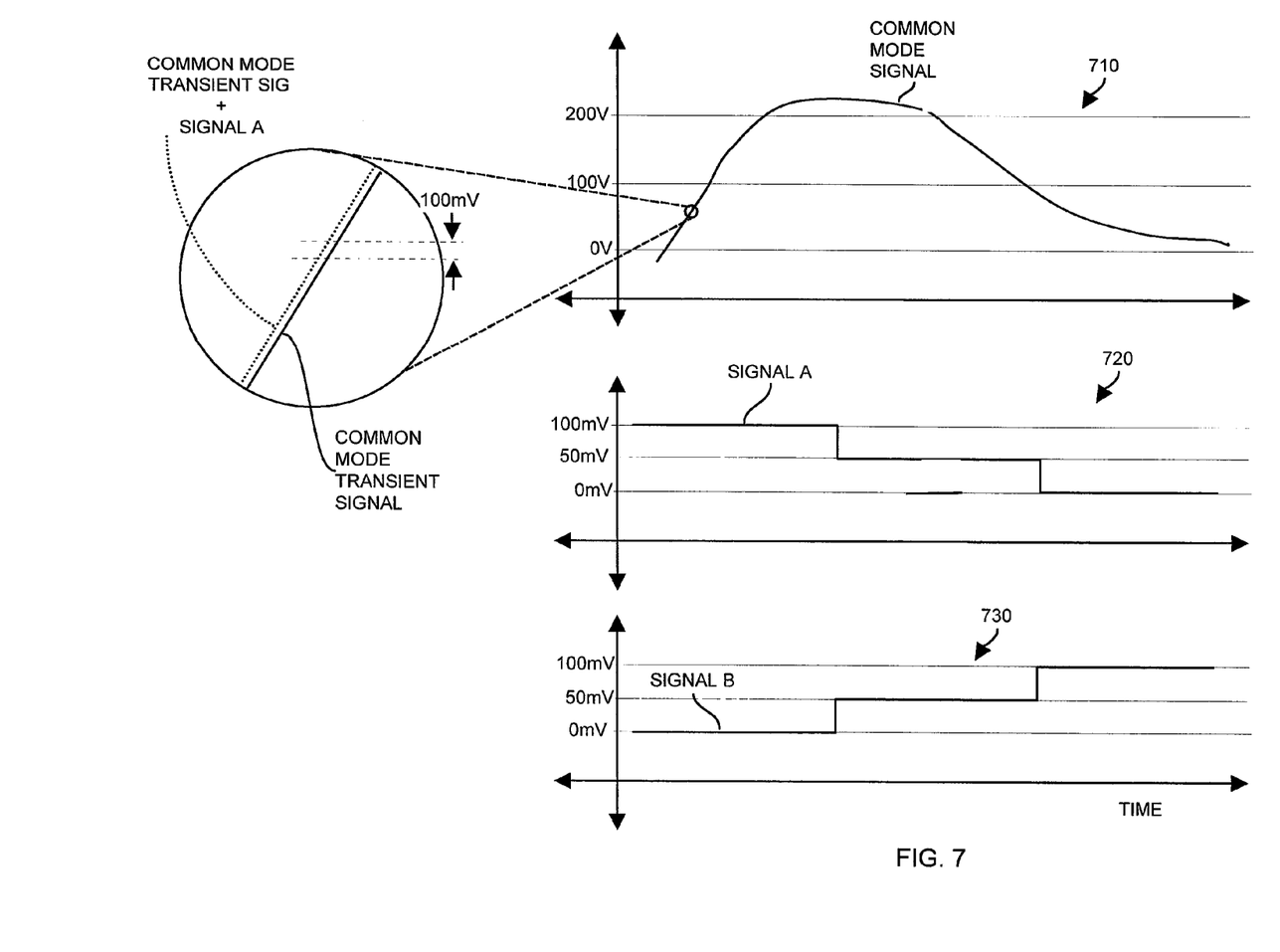
FIG. 7 is an example timing diagram illustrating removal of a common mode transient signal from a received signal according to embodiments herein.

FIG. 7 is an example timing diagram illustrating removal of a common mode transient signal from a received signal according to embodiments herein.

Graph 710 illustrates how the common mode transient signal varies substantially over time. As previously discussed, signal A is offset by a magnitude of the common mode transient signal. Signal B is offset by the magnitude of the common mode transient signal.

Application of the adjustment signal 691-1 to the node 288-1 results in AC signal A as shown in the graph 720 inputted to the positive input of the receiver 260.

Application of the adjustment signal 691-2 to the node 288-2 results in AC signal B as shown in graph 730 inputted to the negative input of the receiver 260.

Thus, the gain-adjusted adjustment signals 691 remove the common mode transient signal (AC signal) from each of the communication paths 254-1 and 254-2.

Figure 8:
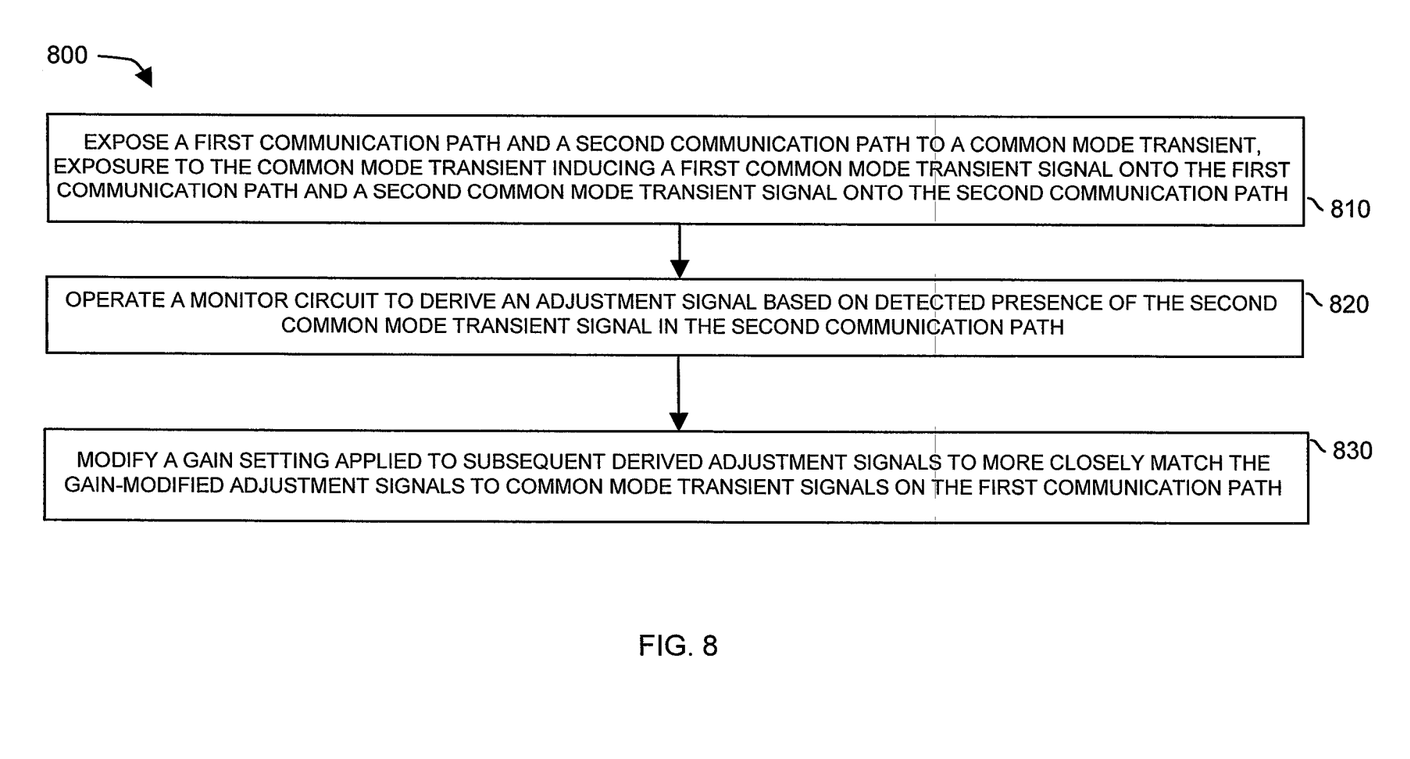
FIG. 8 is an example diagram illustrating a method of adjusting gain levels to provide increased common mode transient immunity according to embodiments herein.

FIG. 8 is a flowchart 800 illustrating an example method of a communication technique according to embodiments herein. Note that there will be some overlap with respect to concepts as discussed above. Also, the steps can be executed in any suitable order.

In processing block 810, the communication path 254-2 and replica communication path 254-3 are exposed to a common mode transient. Exposure to the common mode transient induces a common mode transient signal I2 onto the communication path 254-2 and common mode transient signal I3 onto the replica communication path 254-3.

In processing block 820, the monitor circuit 262 derives an adjustment signal 191-2 based on detected presence of the common mode transient signal I3 in the replica communication path 254-3.

In processing block 830, the gain modifier circuit 650 modifies a gain setting applied to subsequent derived adjustment signals 191-2 to more closely match the gain-modified adjustment signals 691-2 to common mode transient signals I2 on the communication path 254-2.

Note again that techniques herein are well suited for reliably conveying a data signal to control a remote power supply circuit such as control/synchronous switches in a switching power supply application. However, it should be noted that embodiments herein are not limited to use in such applications and that the techniques discussed herein are well suited for other applications as well.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

I claim:

1. An apparatus comprising:
   a first communication path and a second communication path exposed to a common mode transient, exposure to the common mode transient inducing a first common mode transient signal onto the first communication path and a second common mode transient signal onto the second communication path;
   a monitor circuit to derive an adjustment signal based on detected presence of the second common mode transient signal present on the second communication path;
   a gain modifier circuit to modify a gain setting applied to subsequent derived adjustment signals produced by the monitor circuit, the gain setting applied to more closely match the gain-modified adjustment signals to common mode transient signals on the first communication path; and
   wherein the gain-modified adjustment signals cancel corresponding common mode transient signals on the first communication path.

2. The apparatus as in claim 1, wherein the gain-modified adjustment signals are simulated current drive signals outputted from the monitor circuit to the first communication path.

3. The apparatus as in claim 1, wherein the gain setting accounts for a mismatch in series capacitance between the first communication path and the second communication path.

4. The apparatus as in claim 1, wherein the first communication path supports conveyance of a first signal of a differential signal pair; and
   wherein the second communication path is allocated to detect presence of common mode transients.

5. The apparatus as in claim 1, wherein a control circuit initiates simultaneously driving both the first communication path and the second communication path with DC (Direct Current) signals during a test mode.

6. The apparatus as in claim 1 further comprising;
   a gain circuit, the gain circuit applying the gain setting to gain-adjust a subsequent transient signal detected on the second communication path, the gain circuit outputting the gain-adjusted subsequent transient signal to the first communication path.

7. An apparatus comprising:
   a first communication path and a second communication path exposed to a common mode transient, exposure to the common mode transient inducing a first common mode transient signal onto the first communication path and a second common mode transient signal onto the second communication path;
   a monitor circuit to derive an adjustment signal based on detected presence of the second common mode transient signal present on the second communication path;
   a gain modifier circuit to modify a gain setting applied to subsequent derived adjustment signals produced by the monitor circuit, the gain setting applied to more closely match the gain-modified adjustment signals to common mode transient signals on the first communication path; and
   wherein the gain modifier circuit receives feedback from a comparator circuit that monitors the first communication path, the gain modifier circuit utilizing the feedback to adjust the gain setting.

8. The apparatus as in claim 7, wherein the feedback indicates whether a magnitude of a given adjustment signal matches a magnitude of a corresponding common mode transient signal present on the first communication path.

9. The apparatus as in claim 8, wherein a trim circuit modifies a threshold setting of the comparator circuit to produce the feedback, the comparator circuit monitoring a mismatch between the given adjustment signal and the corresponding common mode transient signal present on the first communication path.

10. A method comprising:
    exposing a first communication path and a second communication path to a common mode transient, exposure to the common mode transient inducing a first common mode transient signal onto the first communication path and a second common mode transient signal onto the second communication path;
operating a monitor circuit to derive an adjustment signal based on detected presence of the second common mode transient signal in the second communication path;
modifying a gain setting applied to subsequent derived adjustment signals to more closely match the gain-modified adjustment signals to common mode transient signals on the first communication path; and
utilizing the gain modified adjustment signals to cancel the common mode transient signals on the first communication path.

11. The method as in claim 10, wherein the gain modified adjustment signals are simulated current drive signals outputted from the monitor circuit to the first communication path.

12. The method as in claim 10, wherein the modified gain setting accounts for a mismatch in series capacitance between the first communication path and the second communication path.

13. The method as in claim 10, wherein the first communication path supports conveyance of a first signal of a differential signal pair; and
wherein the second communication path is allocated to test for presence of common mode transients.

14. The method as in claim 10, wherein exposing the first communication path and the second communication path further comprises:
during exposure, simultaneously driving both the first communication path and the second communication path with DC (Direct Current) signals.

15. The method as in claim 10 further comprising:
subsequent to modifying the gain setting, utilizing the first communication path to communicate a communication signal to a target recipient;
applying the gain setting to gain-adjust a subsequent transient signal detected on the second communication path; and
applying the gain-adjusted subsequent transient signal to the first communication path.

16. The method as in claim 10 further comprising:
applying the gain modified adjustment signals to a node of the first communication path.

17. A method comprising:
exposing a first communication path and a second communication path to a common mode transient, exposure to the common mode transient inducing a first common mode transient signal onto the first communication path and a second common mode transient signal onto the second communication path;
operating a monitor circuit to derive an adjustment signal based on detected presence of the second common mode transient signal in the second communication path;
modifying a gain setting applied to subsequent derived adjustment signals to more closely match the gain-modified adjustment signals to common mode transient signals on the first communication path;
wherein modifying the gain setting further comprises:
receiving feedback from a comparator circuit that monitors the first communication path; and
utilizing the feedback to adjust the gain setting.

18. The method as in claim 17, wherein the feedback indicates whether a magnitude of a given adjustment signal matches a magnitude of a corresponding common mode transient signal present on the first communication path.

19. The method as in claim 18 further comprising:
modifying a threshold setting of the comparator circuit to produce the feedback, the comparator circuit monitoring for a mismatch between the given adjustment signal and the corresponding common mode transient signal present on the first communication path.

20. An apparatus comprising:
a first communication path and a second communication path exposed to a common mode transient, exposure to the common mode transient inducing a first common mode transient signal onto the first communication path and a second common mode transient signal onto the second communication path;
a monitor circuit to derive an adjustment signal based on detected presence of the second common mode transient signal present on the second communication path;
a gain modifier circuit to modify a gain setting applied to subsequent derived adjustment signals produced by the monitor circuit, the gain setting applied to more closely match the gain-modified adjustment signals to common mode transient signals on the first communication path; and
wherein the monitor circuit is operable to monitor a magnitude of current over the second communication path to detect the presence of the second common mode transient signal received over the second communication path.

21. The apparatus as in claim 20 further comprising:
a signal generator circuit operable to produce a first adjustment signal based on the magnitude of the current detected over the second communication path.

22. The apparatus as in claim 21 further comprising:
a gain stage operable to receive the gain setting and apply a respective gain as specified by the gain setting to the first adjustment signal to produce a gain-modified adjustment signal to cancel a corresponding common mode transient signal received over the first communication path.

23. An apparatus comprising:
a first communication path and a second communication path exposed to a common mode transient, exposure to the common mode transient inducing a first common mode transient signal onto the first communication path and a second common mode transient signal onto the second communication path;
a monitor circuit to derive an adjustment signal based on detected presence of the second common mode transient signal present on the second communication path;
a gain modifier circuit to modify a gain setting applied to subsequent derived adjustment signals produced by the monitor circuit, the gain setting applied to more closely match the gain-modified adjustment signals to common mode transient signals on the first communication path; and
wherein the gain-modified adjustment signals are simulated current signals whose magnitude varies depending on detected current received over the second communication path.

24. The apparatus as in claim 1, wherein a first end of the second communication path is referenced with respect to a first ground potential; and
wherein a second end of the second communication path is referenced with respect to a second ground potential.

* * * * *